(12) United States Patent
Kitagawa et al.

(10) Patent No.: US 7,276,907 B2
(45) Date of Patent: Oct. 2, 2007

(54) MAGNETIC RESONANCE IMAGING SYSTEM

(75) Inventors: Seiichi Kitagawa, Tokyo (JP); Takami Sato, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 647 days.

(21) Appl. No.: 10/791,120

(22) Filed: Mar. 2, 2004

(65) Prior Publication Data

US 2004/0174167 A1    Sep. 9, 2004

(30) Foreign Application Priority Data

Mar. 7, 2003   (JP)   ............... 2003-060963

(51) Int. Cl.
*G01V 3/00*   (2006.01)
(52) U.S. Cl. ..................... 324/318; 248/633
(58) Field of Classification Search ............... 324/318, 324/319, 320, 322; 248/633, 638
See application file for complete search history.

(56) References Cited

U.S. PATENT DOCUMENTS

| | | | |
|---|---|---|---|
| 4,115,695 A | | 9/1978 | Kelman |
| 5,016,638 A | | 5/1991 | Hsieh |
| 5,129,232 A | * | 7/1992 | Minas et al. ............ 62/51.1 |
| 5,238,215 A | | 8/1993 | Jeker et al. |
| 5,573,220 A | * | 11/1996 | Whittaker et al. ......... 248/638 |
| 6,043,653 A | * | 3/2000 | Takamori et al. .......... 324/309 |
| 6,169,404 B1 | | 1/2001 | Eckels |
| 6,198,371 B1 | * | 3/2001 | Laskaris et al. ........... 335/299 |
| 6,774,633 B2 | * | 8/2004 | Wang et al. .............. 324/318 |
| 7,093,815 B2 | * | 8/2006 | Stofiel ..................... 248/633 |

FOREIGN PATENT DOCUMENTS

| | | |
|---|---|---|
| JP | 2002-159465 | 6/2002 |
| JP | 2002-325745 | 11/2002 |
| WO | WO-02-052292 A1 | 7/2002 |

OTHER PUBLICATIONS

European Search Report; Munich; Application No. EP 04251219; (2 pgs.).
Maple S R et al; "A Platform for Vibration Damping, Leveling, and Height Control of High-Resolution Superconducting Magnets"; Journal of Magnetic Resonance, 82, 382-386 (1989).

* cited by examiner

*Primary Examiner*—Louis M. Arana
(74) *Attorney, Agent, or Firm*—Armstrong Teasdale LLP (57) ABSTRACT

Provided is a magnetic resonance imaging system in which the posture of a magnet can be easily adjusted and the adverse effect on images can be suppressed. The magnetic resonance imaging system comprises a magnet that induces a static magnetic field, and legs that support the magnet and stand on a placement surface. The leg includes a posture adjustment mechanism that adjusts the posture of the magnet and an attenuation pad that attenuates a vibration applied through the placement surface into a vibration whose frequency is different from the resonant frequency of the magnet.

20 Claims, 7 Drawing Sheets

MAGNETIC RESONANCE IMAGING SYSTEM

CROSS REFERENCE TO RELATED APPLICATIONS

This application claims the benefit of Japanese Application No. 2003-060963 filed Mar. 7, 2003.

BACKGROUND OF THE INVENTION

The present invention relates to a magnetic resonance imaging system utilizing magnetic resonance.

As described in, for example, Japanese Unexamined Patent Application Publication No. 2002-159465, a magnetic resonance imaging (MRI) system is a modality for imaging a region to be examined of a subject lying down in a static magnetic field space by utilizing magnetic resonance.

A magnet such as a permanent magnet is used to induce a static magnetic field. The magnet is borne by legs that are used to adjust the posture of the magnet and disposed on the floor in an installation site of an MRI system. For example, when the magnet is disposed in the installation site or if a gap is created between the floor and any of the legs because the floor has deformed time-sequentially, the posture of the magnet must be adjusted in order to correct the direction of the static magnetic field so that the direction of the static magnetic field will be aligned with a predetermined direction.

Conventionally, an adjustment sheet having a predetermined thickness is sandwiched between the floor and the leg in order to adjust the posture of the magnet. For the adjustment of the posture of the magnet, for example, a jack is used to cause the magnet and leg to float above the floor. The adjustment sheet is then sandwiched between the floor and the leg. Japanese Unexamined Patent Application Publication No. 2002-159465.

However, it is time-consuming to adjust the posture of the magnet using a special tool such as the jack. If the jack is made of a magnetic material such as iron, the jack is attracted to the magnet. This hinders the adjustment work. Furthermore, when the adjustment sheet is merely sandwiched between the floor and the leg, the vibration of the floor is propagated to the magnet through the portion of the placement surface of the floor under the leg. The vibration may adversely affect images resulting from magnetic resonance imaging.

SUMMARY OF THE INVENTION

Therefore, an object of the present invention is to provide a magnetic resonance imaging system in which the posture of a magnet can be adjusted easily and the adverse effect of the adjustment on images can be suppressed.

A magnetic resonance imaging system in accordance with the present invention comprises a magnet that induces a static magnetic field needed for magnetic resonance imaging, and a supporting means that supports the magnet and stands on a placement surface. The supporting means comprises a posture adjusting means that adjusts the posture of the magnet, and an attenuating means that attenuates the vibration applied through the placement plane into a vibration whose frequency is different from the resonant frequency of the magnet.

According to the present invention, a magnetic resonance imaging system comprises a magnet that induces a static magnetic field needed for magnetic resonance imaging, and three pieces of supporting means that support the magnet and stand on a placement plane. The three pieces of supporting means each include an attenuating means that attenuates the vibration applied through the placement surface into a vibration whose frequency is different from the resonant frequency of the magnet. Moreover, at least two of the three pieces of supporting means include a posture adjusting means that adjusts the posture of the magnet.

In a magnetic resonance imaging system in which the first aspect of the present invention is implemented, a magnet induces a static magnetic field needed for magnetic resonance imaging. The magnet is disposed on the placement surface while being supported by a supporting means. A posture adjusting means included in the supporting means is used to adjust the posture of the disposed magnet. An attenuating means included in the supporting means attenuates the vibration applied through the placement surface into a vibration whose frequency is different from the resonant frequency of the magnet.

In a magnetic resonance imaging system in which the second aspect of the present invention is implemented, a magnet induces a static magnetic field needed for magnetic resonance imaging. The magnet is disposed on a placement surface while being supported by three pieces of supporting means.

At least two of the three pieces of supporting means include a posture adjusting means. The two pieces of posture adjusting means are used to adjust the posture of the magnet. Attenuating means included in the three respective pieces of supporting means attenuate the vibration applied through the placement surface into a vibration whose frequency is different from the resonant frequency of the magnet.

According to the present invention, there is provided a magnetic resonance imaging system in which the posture of a magnet can be easily adjusted, and the adverse effect on images can be suppressed.

Further objects and advantages of the present invention will be apparent from the following description of the preferred embodiments of the invention as illustrated in the accompanying drawings.

DETAILED DESCRIPTION OF THE INVENTION

Referring to the appended drawings, an embodiment of the present invention will be described below.

Figure 1A:
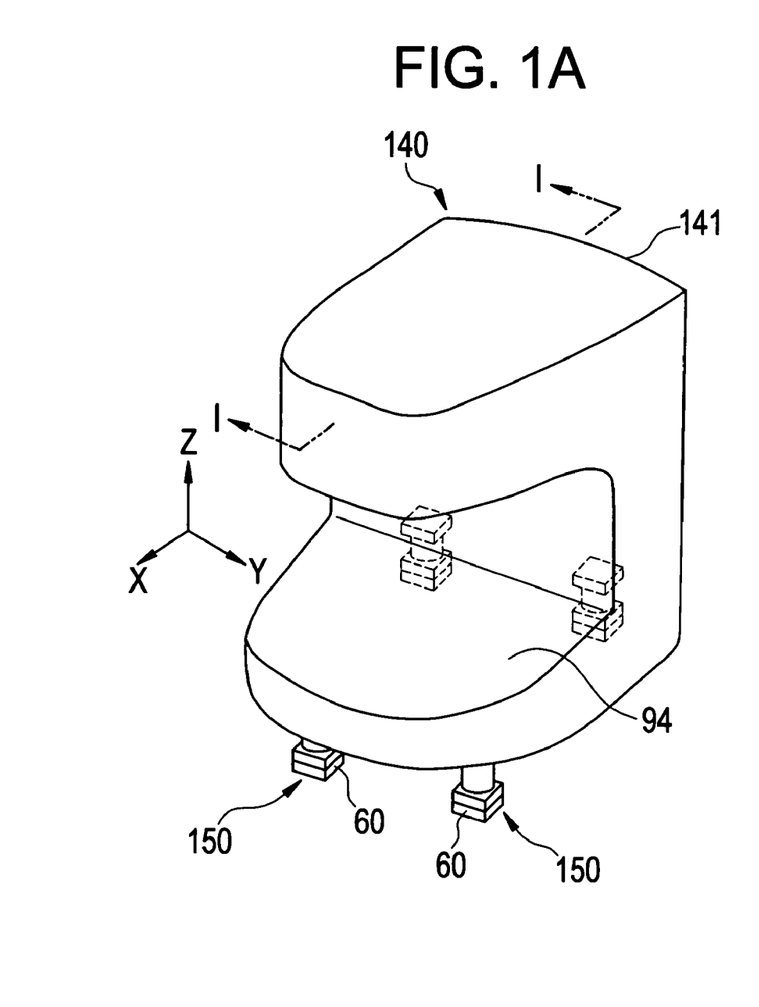
FIG. 1(a) is a perspective view of a magnet system included in an embodiment of the present invention.
Figure 1B:
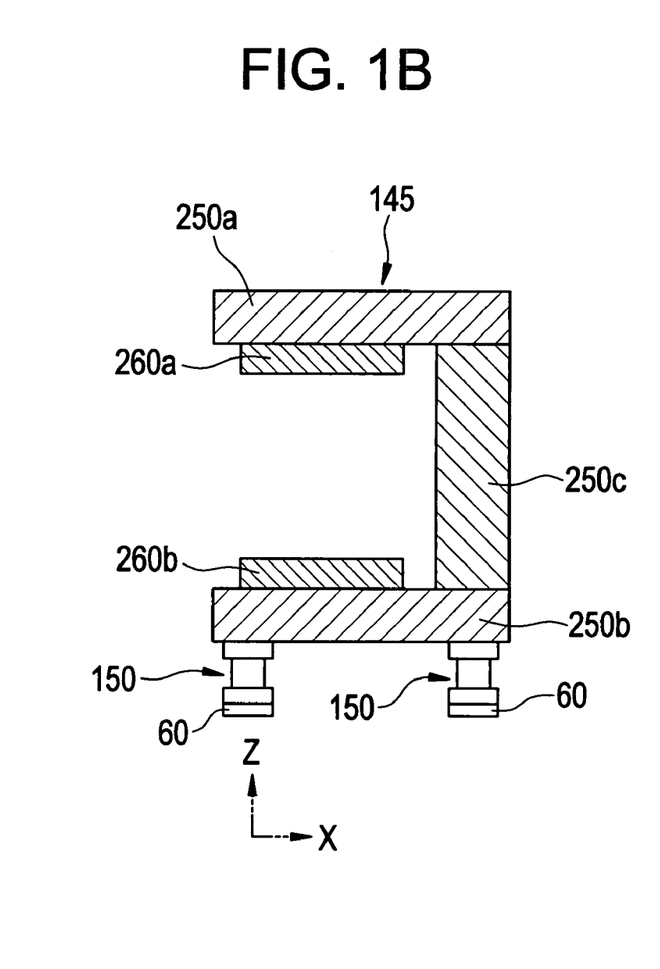
FIG. 1(b) is a sectional view of a magnet included in the magnet system and seen in an I-I direction indicated in FIG. 1(a).
Figure 2:
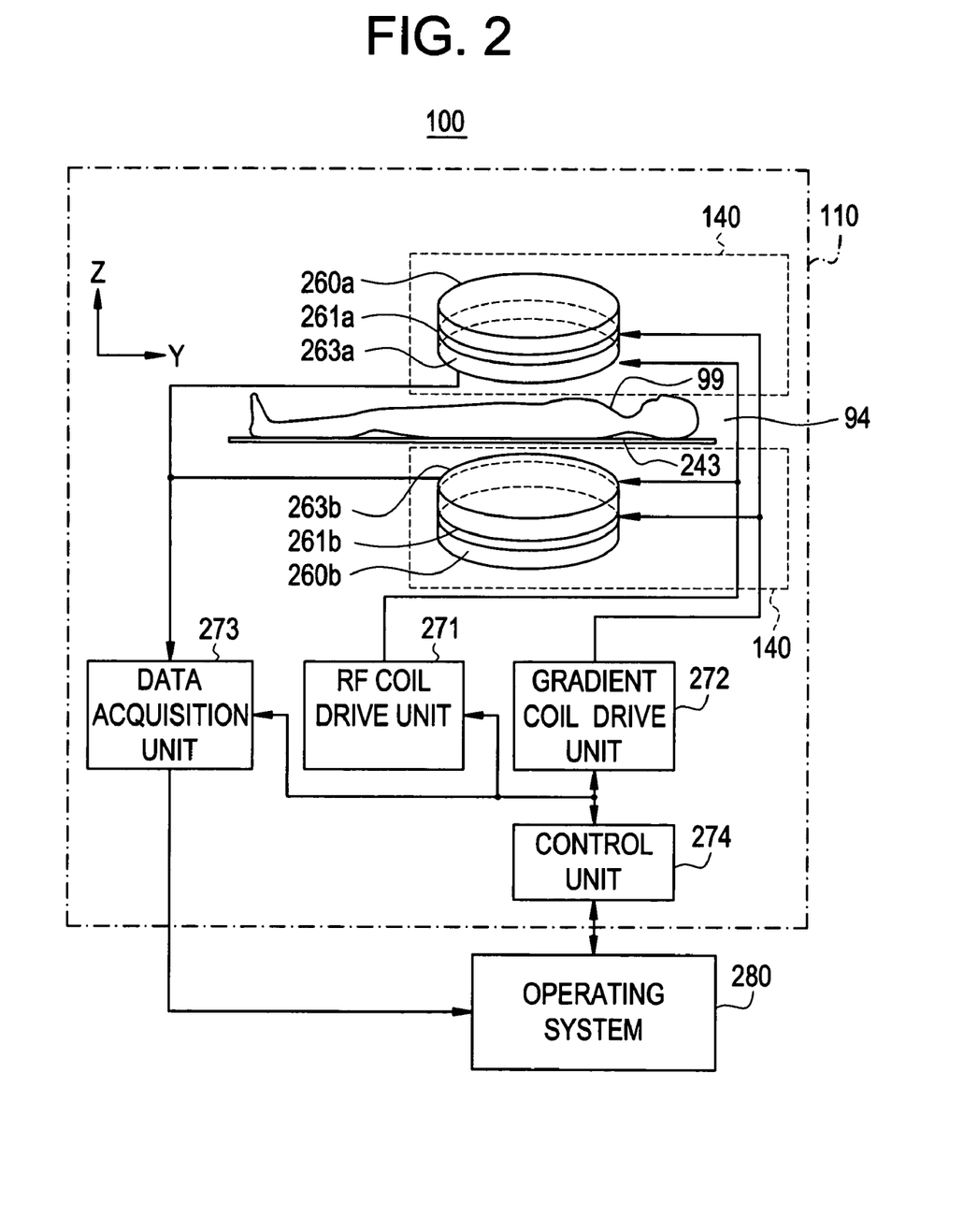
FIG. 2 shows the overall configuration of an MRI system in accordance with the embodiment of the present invention.

FIG. 1(a), FIG. 1(b), and FIG. 2 show the major parts of an MRI system in accordance with an embodiment of the present invention, and the appearance of the MRI system.

As shown in FIG. 1(a), FIG. 1(b), and FIG. 2, an MRI system 100 in accordance with the present embodiment comprises an MRI system body 110 and an operating system 280.

The MRI system body 110 comprises a magnet system 140, an RF coil drive unit 271, a gradient coil drive unit 272, a data acquisition unit 273, and a control unit 274.

FIG. 1(a) is a perspective view of the magnet system 140. As shown in FIG. 1(a), the magnet system 140 includes a housing 141 and legs 150.

The legs 150 serve as a concrete example of the supporting means included in the present invention.

A magnet 145 is accommodated in the housing 141. FIG. 1(b) is a sectional view of the magnet 145 seen in an I-I direction indicated in FIG. 1(a).

According to the present embodiment, for example, a permanent magnet is adopted as the magnet 145. However, aside from the permanent magnet, a magnet for inducing a magnetic field such as a superconducting magnet or a resistive magnet may be adopted as the magnet 145.

The magnet 145 that is a permanent magnet comprises a plurality of yokes 250a to 250c and magnetic pole units 260a and 260b. The plurality of yokes 250a to 250c will be generically called yokes 250.

According to the present embodiment, the magnet 145 is, as shown in FIG. 1(b), formed like letter C using the plurality of yokes 250. As a material to be made into the yokes 250, for example, iron is adopted. The yokes 250 work to support the overall structure of the magnet 145.

The magnetic pole units 260a and 260b are mounted on the yokes 250 so that they will be opposed to each other in a Z direction indicated in FIG. 1(b). Each of the magnetic pole units 260a and 260b is formed by stacking ferromagnetic ceramic blocks, which are magnetized using an electromagnet, on the yoke, and mounting an iron plate on the side of the blocks opposed to the side of blocks stacked on the opposite yoke.

A subject is positioned in a space 94 between the magnetic pole units 260a and 260b. According to the present embodiment, since the housing 141 is formed in line with the contour of the magnet 145 shaped like letter C, the majority of the space 94 is open. Therefore, the magnet system 140, like the one shown in FIG. 1(a), is referred to as an open type magnet system.

A static magnetic field is induced in the space 94 owing to the magnetized ceramic blocks forming the magnetic pole units 260a and 260b. The iron plates on the mutually facing sides of the respective magnetic pole units 260a and 260b re-shape and homogenize an induced magnetic field.

A static magnetic field is induced in the direction of arrow Z in FIG. 1(a) and FIG. 1(b). The Z direction is a direction orthogonal to the body-axis direction of a subject. Therefore, the magnetic field in the Z direction is called a vertical magnetic field. A static magnetic field induced by the magnetic pole units 260a and 260b is confined and intensified by the yokes 250.

The legs 150 support the magnet system 140. According to the present embodiment, the number of legs 150 is four. However, the number of legs 150 may be four or less or four or more as long as the legs can reliably support the magnet system 140. According to the present embodiment, the four legs 150 are arranged in twos on the front side of the magnet system 140 on which the space 94 is formed, and the back side thereof with adjoining legs separated from each other by a predetermined distance. The legs 150 are attached to the lower side of the lower yoke 250b included in the magnet 145. The structure and capability of the legs 150 will be detailed later.

The magnet system 140 includes, in addition to the magnet 145, gradient coil units 261a and 261b and radio-frequency (RF) coil units 263a and 263b. The gradient coil units 261a and 261b are, for example, as shown in FIG. 2, mounted on the mutually facing sides of the respective magnetic pole units 260a and 260b so that they will be opposed to each other. The RF coil units 263a and 263b are mounted on the mutually facing sides of the respective gradient coil units 261a and 261b.

A subject 99 is carried into the space 94 while lying down on a cradle 243. The subject 99 is, for example, positioned so that his/her body axis will match the direction of arrow Y in FIG. 1(a) and FIG. 2. In order to produce good-quality magnetic resonance images, a region to be examined of the subject 99 is aligned with a position in the space 94 in which the most homogeneous static magnetic field is induced.

Each of the RF coil units 263a and 263b includes a transmission RF coil that transmits a radio-frequency wave to a region to be examined of the subject 99, and a reception RF coil that receives a radio-frequency signal which is radiated from the region to be examined along with the transmission of the radio-frequency wave.

For example, dedicated coils are adopted as the transmission RF coil and reception RF coil respectively. However, depending on the region to be examined or the shape of a coil, the same coil may be used as both the transmission RF coil and reception RF coil.

An RF coil drive unit 271 connected to the RF coil units 263a and 263b applies an RF-wave exciting signal to the transmission RF coils included in the RF coil units 263a and 263b respectively. Consequently, the transmission RF coils transmit an RF wave whose frequency corresponds to the resonant frequency at which the spins in the region to be examined are excited, and the spins in the region to be examined are excited.

When transmission of an RF wave from the transmission RF coils is stopped, an RF signal whose frequency corresponds to the resonant frequency is re-radiated from the region to be examined because of the excitation of the spins in the region to be examined. The reception RF coils receive the RF signal from the region to be examined. The RF signal received by the reception RF coils is referred to as a magnetic resonance signal.

The data acquisition unit 273 is connected to the reception RF coils included in the respective RF coil units 263a and 263b. The data acquisition unit 273 fetches an RF signal received by the reception RF coils so as to acquire data used to produce a magnetic resonance image.

Each of the gradient coil units 261a and 261b includes three gradient coils that are needed to provide a magnetic resonance signal, which is received by the reception RF coils, with three-dimensional position information. The gradient coil drive unit 272 connected to the gradient coil units 261a and 261b transmits a magnetic field gradient exciting signal to the three gradient coils. The gradient coils having received the magnetic field gradient exciting signal induce a magnetic field gradient which gives a gradient to the strength of the static magnetic field induced by the magnet 145.

The control unit 274 controls the RF coil drive unit 271, gradient coil drive unit 272, and data acquisition unit 273 in response to a command entered at the operating system 280 so that a desired magnetic resonance signal can be acquired.

The operating system 280 is installed away from the MRI system body 110. The MRI system 100 is operated using the operating system 280. The operating system 280 comprises an operating unit, a data processing unit, and a display unit, though these units are not shown. The operating unit is used to transmit an operator-entered operating command to the data processing unit and control unit 274. The data processing unit processes data received from the data acquisition unit 273 according to the operator-entered command so as to produce a magnetic resonance image. The produced magnetic resonance image and an operating screen image that assists an operator to operate the MRI system 100 are displayed on the display unit.

Figure 3:
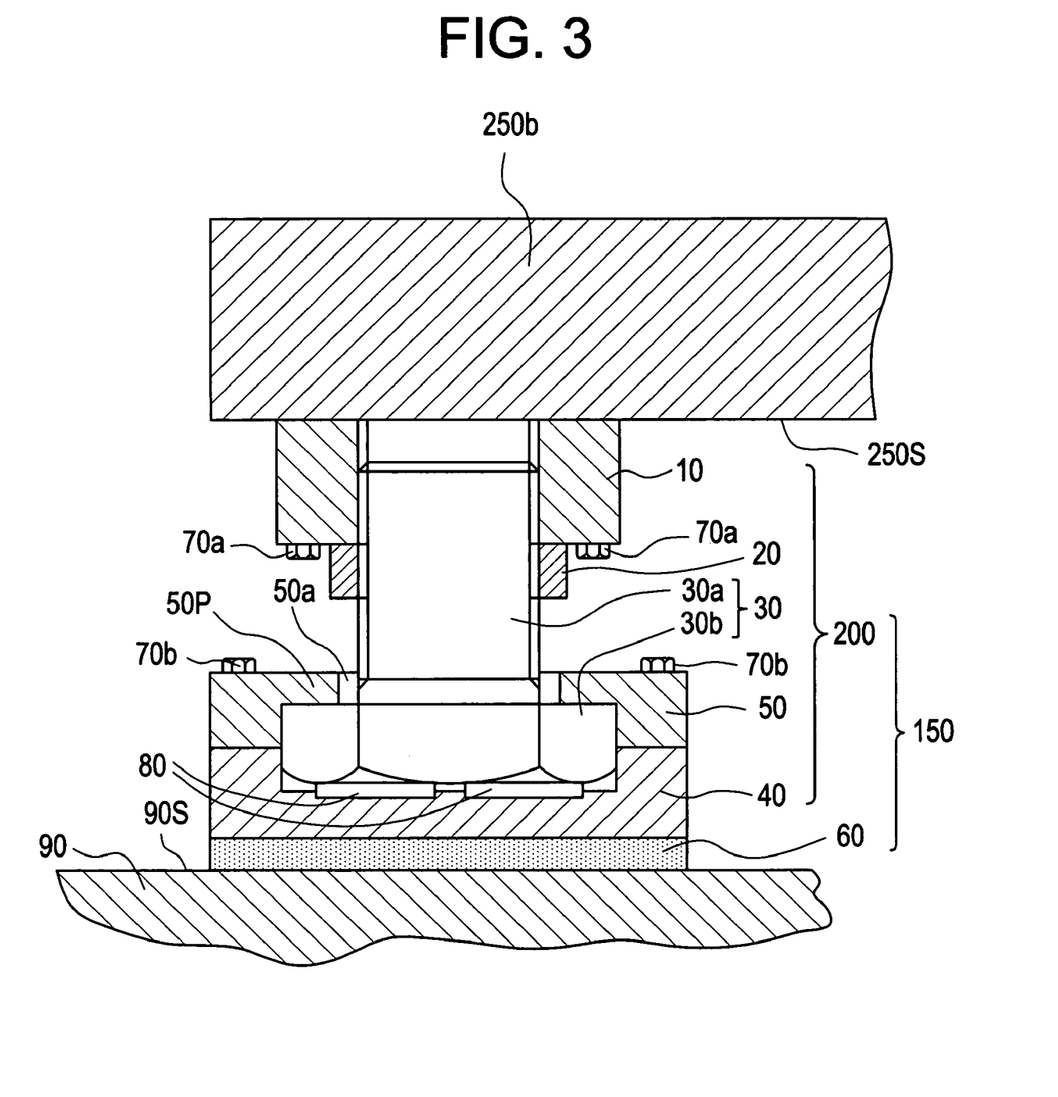
FIG. 3 is a sectional view of a leg shown in FIG. 1(b).
Figure 4:
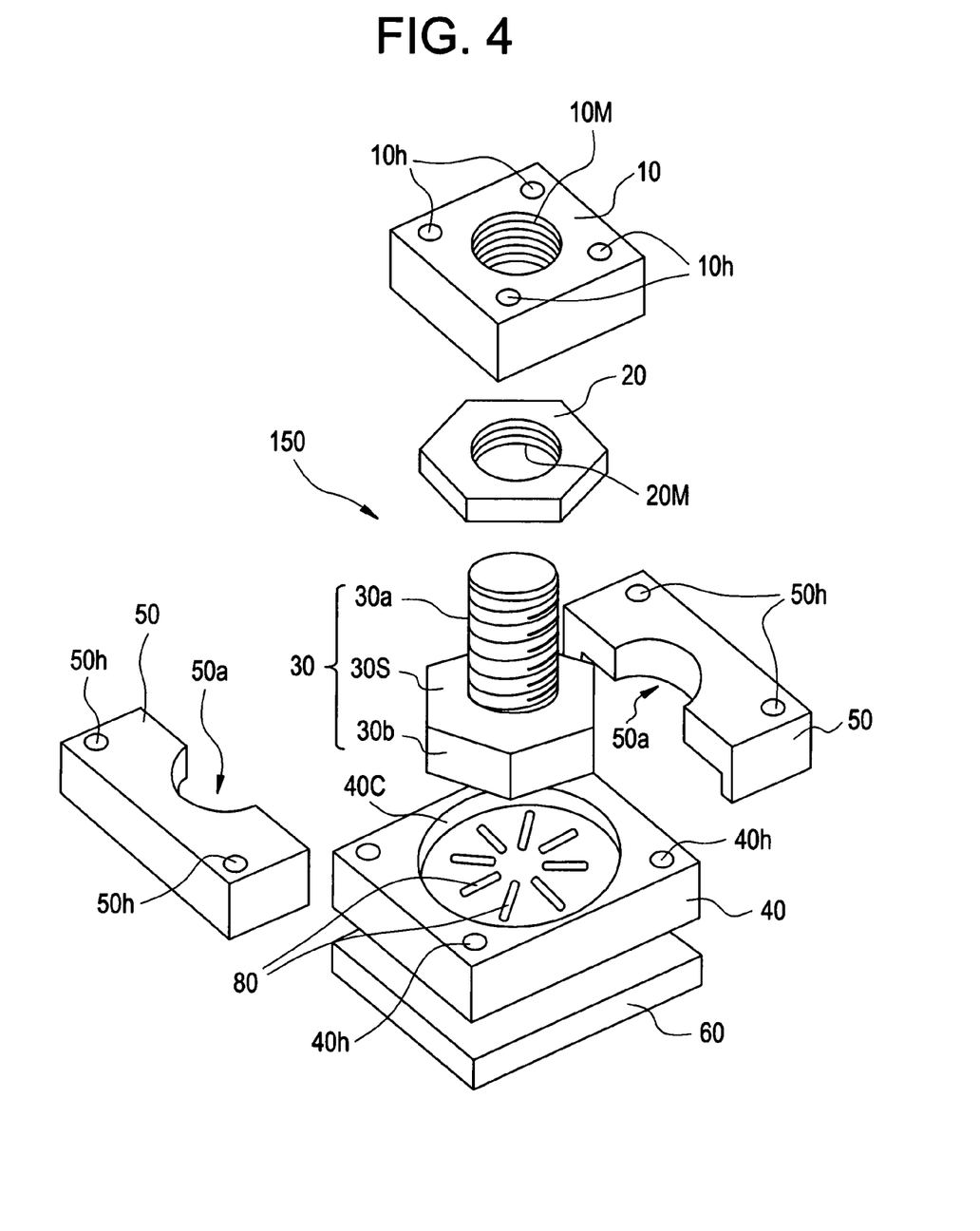
FIG. 4 is an exploded perspective view of the leg shown in FIG. 3.

Referring to FIG. 3 and FIG. 4, an example of the structure of the legs 150 employed in the present embodiment will be described below. FIG. 3 and FIG. 4 are a sectional view and an exploded perspective view showing one leg 150.

The leg 150 shown as an example in FIG. 3 and FIG. 4 includes a posture adjustment mechanism 200 and an attenuation pad 60. The posture adjustment mechanism 200 is an example of the posture adjusting means included in the present invention, and the attenuation pad 60 is an example of the attenuating means included therein.

Moreover, the leg 150 includes a female screw pedestal 10, a locking nut 20, a bolt member 30, a supporting pedestal 40, and head covers 50. The female screw pedestal 10, locking nut 20, bolt member 30, supporting pedestal 40, and head covers 50 are examples of a female screw, a locking member, a male screw, a supporting member, and a pressing member included in the present invention. The female screw pedestal 10 is, for example, a parallelepiped member. A female screw is threaded on the internal wall of a hole 10M of the female screw pedestal 10. The female screw pedestal 10 has bolt holes 10*h*, which are needed to fix the female screw pedestal 10, bored in the same direction as the hole 10M. The female screw pedestal 10 is fixed to the attachment side of the magnet 145. According to the present embodiment, the lower side of the lower yoke 250*b* of the magnet 145 serves as the attachment side. The female screw pedestal 10 is screwed to the attachment side 250 by inserting bolts 70*a* into the bolt holes 10*h*.

The bolt member 30 includes a stem 30*a* and a head 30*b* that are formed continuously. A male screw is threaded on the periphery of the stem 30*a*. The head 30*b* is shaped like, for example, a hexagonal prism so that the bolt member 30 can be easily turned using a wrench or any other tool. The bolt member 30 is meshed with the female screw pedestal 10 via the locking nut 20.

The locking nut 20 has a nut hole 20M that has a female screw threaded on the internal wall thereof. The stem 30*a* of the bolt member 30 is meshed with the nut hole 20M. The stem 30*a* passed through the nut hole 20M is meshed with the hole 10M of the female screw pedestal 10. The bolt member 30 meshed with the female screw pedestal 10 and locking nut 20 can be turned about the center axis of rotation of the stem 30*a* extending in the longitudinal direction of the stem. The locking nut 20 is turned in a predetermined direction and tightened, whereby the turning of the bolt member 30 is restricted. When the locking nut 20 is turned in an opposite direction and thus loosened, the bolt member 30 becomes freely turnable.

Moreover, the locking nut 20 works to improve the rigidity of the posture adjustment mechanism 200 when being tightened.

With the locking nut 20 loosened, the bolt member 30 is turned in a predetermined direction. This causes the distance between the female screw pedestal 10 and head 30*b* to shrink. Consequently, the portion of the stem 30*a* bared outside the female screw pedestal 10 and locking nut 20 gets shorter. When the bolt member 30 is turned in an opposite direction, the distance between the female screw pedestal 10 and head 30*b* swells. Consequently, the portion of the stem 30*a* bore outside the female screw pedestal 10 and locking nut 20 gets longer.

The supporting pedestal 40 supports the head 30*b* of the bolt member 30. The supporting member 40 is, for example, a parallelepiped member having a circular recess 40C in which the head 30*b* can be stowed. The supporting pedestal 40 supports the head 30*b* on the support surface that is the bottom of the recess 40C. The supporting pedestal 40 has bolt holes 40*h*, each of which has a female screw threaded on the internal wall thereof, bored therein. The recess 40C has such a depth that causes part of the head 30*b* to be bared outside the recess 40C. Moreover, preferably, the support surface of the supporting pedestal 40 is a slide surface making it easy to turn the bolt member 30 that has the head 30*b* thereof brought into contact with the support surface.

According to the present embodiment, a plurality or rollers is mounted on the bottom of the recess 40*c* so that the rollers can rotate freely. For example, cylindrical rollers 80 are arranged to radially spread from the center axis of rotation of the bolt member 30. Owing to this structure, the frictional force produced between the head 30*b* and supporting pedestal 40 diminishes. Even when the head 30*b* is pressed on the supporting pedestal 40, the bolt member 30 can be turned with force smaller than the force required when the rollers 80 are not included.

When the rollers 80 are mounted, the contact surfaces of the rollers 80 that come into contact with the head 30*b* serve as the support surface of the supporting pedestal 40 on which the bolt member 30 is supported. Preferably, the head covers 50 are attached to the supporting pedestal 40.

The head covers 50 are members shaped to cover the head 30*b* of the bolt member 30 supported on the supporting pedestal 40. For example, FIG. 3 and FIG. 4 show a pair of head covers 50 that cover the head 30*b* with cover sections 50P. The cover sections 50P clamp the stem 30*a* of the bolt member 30 with the stem 30*a* fitted in the openings 50*a* of the respective cover sections 50P. Moreover, preferably, the head covers 50 are shaped so that they can press the head 30*b* when mounted on the supporting pedestal 40.

The head covers 50 have bolt holes 50*h* that communicate with, for example, the bolt holes 40*h* bored in the supporting pedestal 40 for the purpose of the reliable mounting of the head covers on the supporting pedestal 40. Bolts 70*b* are inserted into the bolt holes 40*h* by way of the bolt holes 50*h*, whereby the head covers 50 are screwed to the supporting pedestal 40.

As shown in FIG. 3, when the head covers 50 are mounted on the supporting pedestal 40, the cover sections 50P of the head covers 50 cover the head 30*b* of the bolt member 30 and press it. The side of the head 30*b* near the stem 30*a* serves as a pressed side 30S that is pressed by the cover sections 50P.

The cover sections 50P press the head 30b against the support surface of the supporting pedestal 40, whereby the rigidity of the posture adjustment mechanism 200 improves. Owing to the above structure, the posture adjusting means 200 is fixed to the yoke 250 of the magnet 145.

The attenuation pad 60 is sandwiched between the placement surface 90S of the floor 90, on which the magnet 145 is disposed, and the supporting pedestal 40. The attenuation pad 60 attenuates the vibration applied through the placement surface 90S and thus prevents the vibration from being propagated to the posture adjustment mechanism 200. The attenuation pad 60 is, for example, a sheet member having a predetermined thickness and being made of a rubber material.

The attenuation pad 60 is bonded using, for example, an adhesive to the side of the supporting pedestal 40 opposite to the side on which the support surface is formed. Otherwise, the attenuation pad 60 may be pushed onto the placement surface 90S by utilizing the pressure adjustment section 200 on which the load of the magnet 145 is imposed.

The rubber material can be manufactured so that predetermined elasticity will be maintained. Therefore, the attenuation pad 60 made of the rubber material can suppress the vibration that may be propagated to the posture adjustment mechanism 200 through the placement surface 90S of the floor 90.

As mentioned above, the magnet 145 is supported on the placement surface 90S by means of the legs 150 having the posture adjustment mechanism 200 and the attenuation pad 60.

According to the present embodiment, the legs 150 are made of a non-magnetic material for fear magnetic resonance images may be adversely affected. Specifically, for example, the components of the posture adjustment mechanism 200, that is, the female screw pedestal 10, locking nut 20, bolt member 30, supporting pedestal 40, rollers 80, head covers 50, and bolts 70a and 70b are made of a metal that is hardly magnetized, such as, a stainless steel or aluminum. Moreover, the rubber material to be made into the attenuation pad 60 is not a magnetic material such as a rubber magnet but is a rubber material that is not magnetized by nature.

Since the legs 150 are made of a non-magnetic material, leakage of a static magnetic field induced by the magnet 145 into the legs 150 is prevented. The size and homogeneity of the static magnetic field can be maintained. Since the size and homogeneity of the static magnetic field can be maintained, degradation in the quality of magnetic resonance images can be prevented. Incidentally, the posture adjustment mechanism 200 is structured to be rigid enough to support the magnet 145.

When the posture adjustment mechanism 200 has sufficiently rigidity and is firmly fixed to the magnet 145, the magnet 145 and posture adjustment mechanism 200 may be regarded as one rigid body. In this case, the propagation of a vibration to the magnet 145 through the placement surface 90S varies depending on the difference of the resonant frequency of the attenuation pad 60 from that of the rigid body.

According to the present embodiment, the resonant frequency of the attenuation pad 60 is determined so that the vibration of the magnet 145 deriving from propagation of a vibration to the magnet 145 through the placement surface 90S can be prevented.

How to determine the resonant frequency of the attenuation pad 60 will be detailed below.

Figure 5:
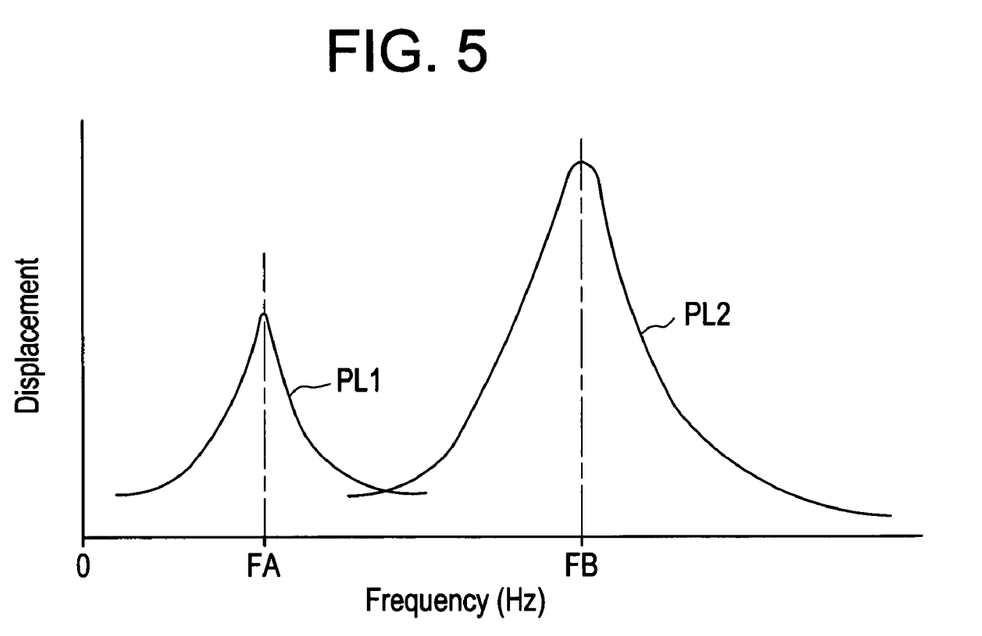
FIG. 5 is a graph indicating the frequency characteristics of an attenuation pad and a magnet included in the embodiment of the present invention.

FIG. 5 is a graph indicating the frequency characteristics of the attenuation pad 60 and magnet 145 respectively. Referring to the graph of FIG. 5, the axis of abscissas indicates the frequency Hz of a vibration to be applied to the attenuation pad 60 and magnet 145, and the axis of ordinates indicates the displacements of the attenuation pad 60 and magnet 145 respectively. FIG. 5 is a graph indicating the degrees of the displacements to which the attenuation pad 60 and magnet 145 are displaced from the reference postures thereof due to application of a vibration to the attenuation pad 60 and magnet 145 that are independent of each other.

A curve PL1 in FIG. 5 indicates the frequency characteristic of the attenuation pad 60, and a curve PL2 indicates the frequency characteristic of the magnet 145.

As shown in FIG. 5, according to the present embodiment, the resonant frequencies of the attenuation pad 60 and magnet 145 that are frequencies at which the displacements are maximized are different from each other. For example, assuming that the resonant frequency FB of the magnet 145 is approximately 50 Hz, the resonant frequency FA of the attenuation pad 60 ranges from about 25 Hz to about 30 Hz.

When the attenuation pad 60 is formed like a sheet using a rubber material, the resonant frequency FA of the attenuation pad 60 can be adjusted by changing the kind of rubber or the thickness of the sheet.

The resonant frequency FA of the attenuation pad 60 is different from the resonant frequency FB of the magnet 145, whereby the resonance between the attenuation pad 60 and magnet 145 is prevented. Moreover, the frequency that may adversely affect image quality will not be amplified and propagated to the magnet 145. Consequently, the vibration of the magnet 145 can be suppressed, and degradation in the quality of magnetic resonance images deriving from the vibration can be suppressed.

The operation of the legs 150 included in the present embodiment will be described below. For example, when the magnet system 140 is placed on the floor 90 in an installation site, when any of the attenuation pads 60 must be replaced with a new one, or when the floor 90 is deformed, the length of the leg 150 concerned is adjusted.

First, the placement of the magnet system 140 on the floor 90 will be described below. Assuming that legs whose lengths are adjusted, like the legs 150 included in the present embodiment, are used to adjust the posture of the magnet 145 so that the magnet 145 will face in any direction, at least three legs 150 must be arranged triangularly. Moreover, at least two of the three legs 150 must have the posture adjustment mechanism 200. By adjusting the lengths of two of the legs 150 arranged triangularly in order to support the magnet 145 at the positions of the apices of the triangle, the inclination of the magnet 145 can be adjusted so that the magnet will face in any direction. By thus adjusting the inclination of the magnet 145, the posture of the magnet 145 can be adjusted so that the magnet will face in any direction.

According to the present embodiment, a vertical magnetic field is induced. In this case, the posture of the magnet 145 is adjusted so that the direction of a static magnetic field induced in the space 94 will be orthogonal to the body axis of the subject 99.

Four or more legs 150 may be fixed to the magnet 145. In this case, one leg 150 devoid of the posture adjustment mechanism 200 and two legs 150 having the posture adjustment mechanism 200 are arranged to form a triangle. In this state, the three legs 150 work in the same manner as the foregoing three legs 150. The other leg 150 is provided with the posture adjustment mechanism 200 and disposed at any position. Owing to this arrangement, when four or more legs 150 are included, the posture of the magnet 145 can be adjusted so that the magnet 145 will face in any direction.

Preferably, for simple adjustment of the posture of the magnet 145 fixed to the magnet 145 should have the posture adjustment mechanism 200. Moreover, in order to suppress the vibration applied through the placement surface 90S of the floor 90, all the legs 150 should have the attenuation pad 60.

Figure 6:
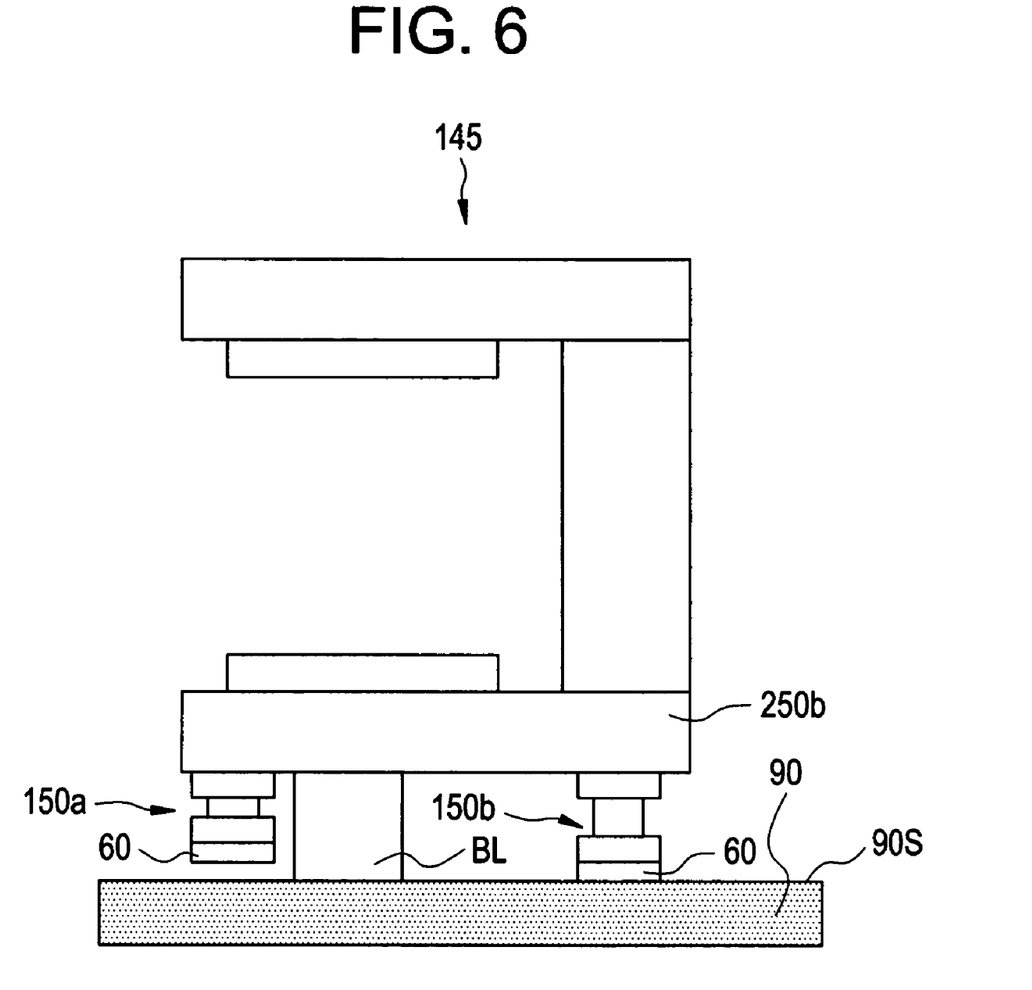
FIG. 6 is a side view of the magnet and leg in a scene where an attenuation pad is replaced with a new one.

FIG. 6 is a side view of the magnet 145 and legs 150 showing a scene where the attenuation pad 60 is replaced with a new one.

Figure 7A:
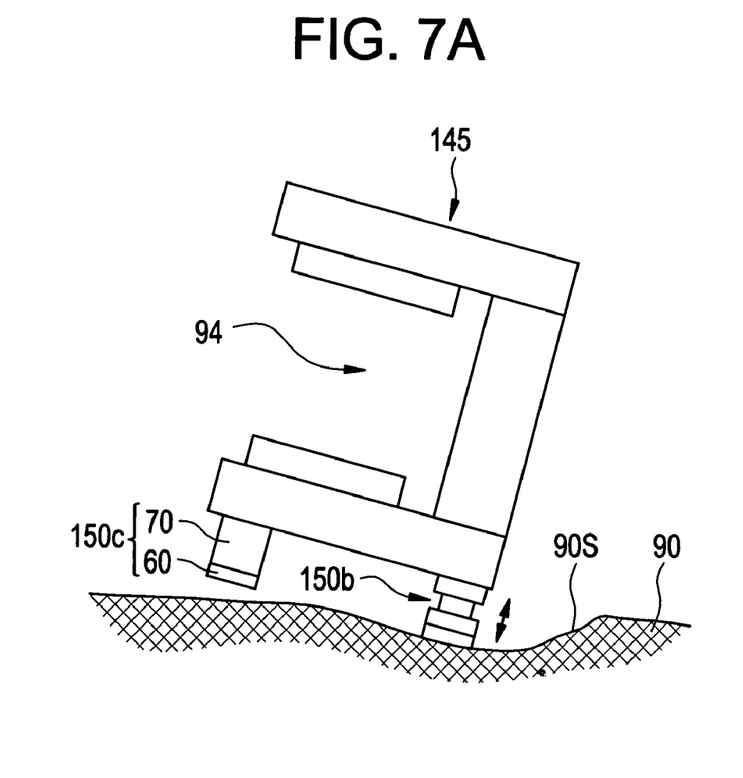
FIG. 7(a) is a side view of the magnet and leg in a case where part of the floor under the leg having a posture adjustment mechanism is deformed to sink.
Figure 7B:
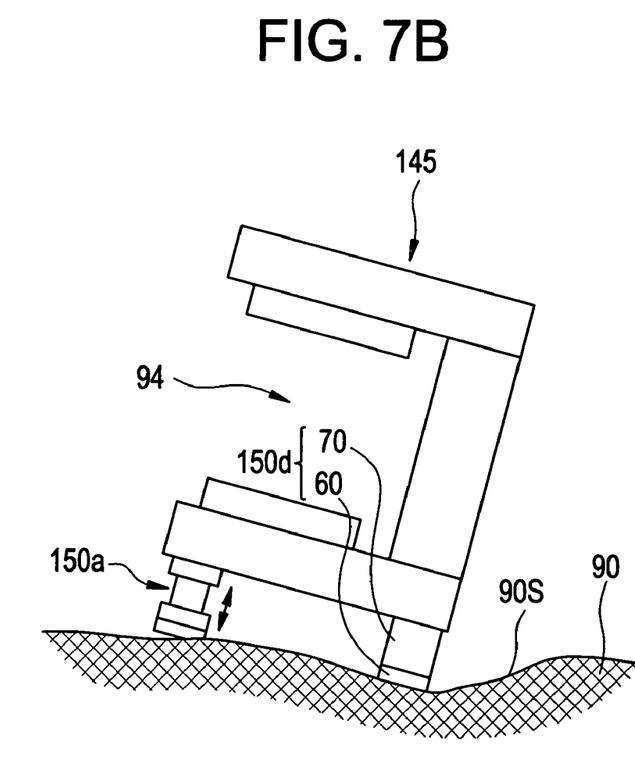
FIG. 7(b) is a side view of the magnet and leg in a case where part of the floor under the leg having a stay is deformed to sink.

Referring to FIG. 6, FIG. 7(a). and FIG. 7(b), the magnet 145 shall have four legs 150 fixed, as shown in FIG. 1(a), squarely thereto.

Two legs 150a and 150b shown in FIG. 6 each have the posture adjustment mechanism 200. For example, when the frequency of the vibration of the floor 90 has changed, when the attenuation capability and frequency characteristic of the attenuation pad 60 have changed due to the deterioration of the attenuation pad, or when a gap is created between the attenuation pad 60 and the placement surface 90S of the floor 90, the attenuation pad 60 is replaced with a new one.

If the frequency of the vibration of the floor 90 changes, the frequency may approach the resonant frequency of the attenuation pads 60 that have already been employed. In this case, the vibration of the floor 90 is amplified and propagated to the magnet 145. Consequently, the attenuation pads 60 are replaced with new ones whose resonant frequency is different from the frequency of the vibration of the floor 90 in order to avoid amplification of the vibration of the floor 90.

If the attenuation pads 60 that have already been employed deteriorate, the attenuation pads fail to attenuate the vibration of the floor 90. Consequently, the vibration of the magnet 45 may be amplified. Moreover, if the frequency characteristic of the attenuation pads 60 changes due to deterioration, the resonant frequency of the attenuation pads 60 approaches the frequency of the vibration of the floor 90. Consequently, the vibration of the floor 90 may be amplified. Therefore, the attenuation pads 60 must be replaced with new ones.

A gap between any of the attenuation pads 60 and the placement surface 90S is derived from, for example, the deterioration of the attenuation pad 60 or the deformation of the floor 90. The floor 90 is designed and constructed so that it can withstand the load of the magnet 145. Nevertheless, the placement surface 90S may be deformed time-sequentially because of the long-term concentration of a load. For example, if the portion of the placement surface 90S under a certain leg 150 is deformed to sink, a gap may be creased between the leg or any other leg 150 and the placement surface 90S. If such a gap is created and the load distribution on the floor 90 changes, the vibration of the floor 90 may be amplified. When a gap that cannot be canceled by adjusting the length of the posture adjustment mechanism 200 must be filled, or when the attenuation pad 60 must be brought into close contact with the deformed portion of the placement surface 90S of the floor 90, the attenuation pad 60 that has already been employed must be replaced with a new attenuation pad 60 whose thickness or softness is different from the old one.

Referring to FIG. 6, a case where the attenuation pad 60 for the leg 150a must be replaced with a new one will be discussed below.

First, a spacer block BL is placed near the leg 150a between the lower yoke 250b of the magnet 145 and the floor 90. Preferably, the spacer block BL is made of a non-magnetic material having sufficient strength such as wood in order to prevent the spacer block BL from being attracted to the yoke 250b due to magnetic force and to simplify work. After the spacer block BL is disposed, the bolts 70b are removed in order to dismount the head covers 50 from the supporting pedestal 40. This causes the head 30b of the bolt member 30 to appear.

Thereafter, a tool such as a wrench is used to turn and loosen the locking nut 20. The head covers 50 are dismounted and the locking nut 20 is loosened, whereby the bolt member 30 can be turned. The head 30b bared from the supporting pedestal 40 is held using, for example, a tool such as a wrench. The bolt member 30 is turned in a direction causing the distance between the female screw pedestal 10 and head 30b to shrink.

While the bolt member 30 is turned, the bolt member 30 advances towards the female screw pedestal 10. The portion of the stem 30a bared outside the female screw pedestal 10 and locking nut 20 gets shorter. Consequently, the load on the placement surface 90S imposed by the leg 150a is removed.

When the legs 150 have the structure shown in FIG. 3 and FIG. 5, if the distance between the female screw pedestal 10 and head 30b shrinks due to turning, the head 30b parts from the supporting pedestal 40 with the supporting pedestal 40 and attenuation pad 60 placed on the placement surface 90S.

However, FIG. 6 shows a state in which one of the legs 150 including the attenuation pad 60 is separated from the placement surface 90S. This is intended to conceptually express that the portion of the stem 30a bore outside the female screw pedestal 10 and locking nut 20 gets shorter and the leg 150a therefore gets shorter.

With the load removed from the supporting pedestal 40, the attenuation pad 60 is replaced with a new one. After the attenuation pad 60 is replaced with a new one, the leg 150a is brought into contact with the placement surface 90S by reversing the foregoing procedure.

Briefly, the bolt member 30 is turned in a direction causing the distance between the female screw pedestal 10 and head 30b to swell. The head 30b is stowed in the recess 40C of the supporting pedestal 40. The bolt member 30 is stretched until an appropriate load will be imposed on the supporting pedestal 40 and attenuation pad 60 and the magnet 140 will assume a desired posture. Thereafter, the locking nut 20 is tightened, the head covers 50 are mounted, and the spacer block BL is removed.

FIG. Fig 7(a) and FIG. 7(b) are side views of the magnet 145 and legs 150 showing cases where part of the floor 90 on which the magnet system 140 is disposed is deformed to sink.

Referring to FIG. 7(a) and FIG. 7(b), the degree of deformation of the floor 90 and the inclination of the magnet 145 are different from real ones but are presented merely for a better understanding.

FIG. 7(a) shows a case where the leg 150b that has sunken due to the deformation of the placement surface 90S has the posture adjustment mechanism 200, and the floating leg 150c includes a stay 70 devoid of the posture adjustment mechanism 200 and the attenuation pad 60.

As shown in FIG. 7(a), when the leg 150b having sunken is provided with the posture adjustment mechanism 200, the leg 150b is stretched to bring the leg 150c into contact with the floor 90. When the magnet 145 is inclined, the spacer block BL is unemployed but the leg 150b is stretched while being in contact with the placement surface 90S.

Specifically, first, the head covers 50 are dismounted from the supporting pedestal 40 and the locking nut 20 is loosened. Thereafter, the bolt member 30 is turned in a direction causing the distance between the female screw pedestal 10 and head 30b to swell. When the bolt member 30 is turned with the head 30b and supporting pedestal 40 in contact with each other, the rollers 80 in contact with the head 30 rotates with the tuning of the head 30b.

The rollers 80 arranged to spread radially from the center axis of rotation of the head 30b rotates in a direction, in which the head 30b is turned to advance, along with the turning of the head 30b. Owing to the thus rotating rollers 80, a slide surface is created. The head 30b supported on the slide surface smoothly slides in contact with the rollers 80. After the leg 150b is stretched to a desired degree, the head covers 50 are mounted and the locking nut 20 is tightened. The posture adjustment mechanism 200 provides sufficient rigidity.

FIG. 7(b) shows a case where the leg 150d having sunken due to the deformation of the placement surface 90S includes the stay 70 devoid of the posture adjustment mechanism 200 and the attenuation pad 60, and the floating leg 150a has the posture adjustment mechanism.

If the leg 150d having sunken is devoid of the posture adjustment mechanism 200, the floating leg 150a is, as shown in FIG. 7(b), stretched to come into contact with the floor 90.

The procedure of stretching the leg 150a and the operation of the posture adjustment mechanism 200 are identical to those for the case described in conjunction with FIG. 7(a). The description of the procedure and operation will therefore be omitted. The leg 150a is brought into contact with the floor 90 so that both the leg 150a and leg 150d can support the magnet 145. Consequently, the posture of the magnet 145 is stabilized. When all the legs 150 fixed to the magnet 145 include the posture adjustment mechanism 200, the procedures described in conjunction with FIG. 7(a) and FIG. 7(b) are used in combination. Consequently, the posture of the magnet 145 can be adjusted more easily, reliably, and highly precisely.

As mentioned above, according to the present embodiment, the legs 150 having the attenuation pad 60 and posture adjustment mechanism 200 are used to support the magnet 145, and are made of a non-magnetic material. Therefore, a static magnetic field induced by the magnet 145 will not be adversely affected.

Moreover, according to the present embodiment, the attenuation pads 60 are in contact with the placement surface 90S. The attenuation pads 60 having elasticity is deformed with the load of the magnet 145 and brought into close contact with the placement surface 90S. Furthermore, the resonant frequency of the attenuation pads 60 is different from the resonant frequency of the magnet 145. Therefore, the attenuation pads 60 and magnet 145 will not be resonant due to the vibration of the floor 90. Consequently, the amplification of the vibration of the magnet 145 is suppressed, and the adverse effect on a static magnetic field is suppressed. As mentioned above, since the legs 150 will not adversely affect a static magnetic field, the adverse effect on the quality of magnetic resonance images can be suppressed to the greatest possible extent.

Moreover, according to the present embodiment, the length of any of the legs 150 is adjusted using the posture adjustment mechanism 200 that includes the bolt member 30. Since the lengths of the legs 150 with which the magnet 145 is supported are variable, the posture of the magnet 145 can be adjusted so that the magnet 145 will face in any direction. The employment of the bolt member 30 obviates the necessity of any special tool such as a hydraulic jack. The posture adjustment work is therefore easy to do.

Furthermore, according to the present embodiment, the support surface of the supporting pedestal 40 on which the bolt member 30 is supported is a slide surface. Therefore, the bolt member 30 can be easily turned while being placed on the supporting pedestal 40. Consequently, even when the load is imposed on the supporting pedestal 40, the bolt member 30 can be easily turned in order to stretch the leg 150b.

Since the posture of the magnet 145 can be adjusted easily, the direction of a static magnetic field can be adjusted readily, reliably, and accurately. This contributes to prevention of degradation in the quality of magnetic resonance images. Noted is that the present invention is not limited to the foregoing embodiment. For example, the present invention can be adapted to a cylindrical type magnetic system in which a space into which a subject is carried is closed instead of the open type magnet system like the one included in the foregoing embodiment.

The attenuation pad 60 may be made of, for example, a resin having appropriate elasticity. The shape of the attenuation pad 60 is not limited to the sheet but may be a block or any other shape. Furthermore, a link mechanism or any other mechanism may be adopted as the posture adjustment mechanism.

Many widely different embodiments of the invention may be configured without departing from the spirit and the scope of the present invention. It should be understood that the present invention is not limited to the specific embodiments described in the specification, except as defined in the appended claims.

The invention claimed is:

1. A magnetic resonance imaging system comprising:
   a magnet that induces a static magnetic field required for magnetic resonance imaging;
   a supporting device that supports said magnet and stands on a placement surface, wherein said supporting device comprises:
   a posture adjusting device for adjusting the posture of said magnet, said posture adjusting device comprising a bolt member substantially aligned in a Z direction; and
   an attenuating device for attenuating a vibration applied through said placement surface into a vibration having a frequency different from a resonant frequency of said magnet.

2. A magnetic resonance imaging system according to claim 1, wherein said supporting device includes the number of pieces of supporting device required to adjust the posture of said magnet so that said magnet will face in any direction.

3. A magnetic resonance imaging system according to claim 1, wherein said supporting device is made of a non-magnetic material.

4. A magnetic resonance imaging system according to claim 1, wherein said posture adjusting device included in said supporting device further comprises:
   a female screw fixed to an attachment side of said magnet;
   a male screw meshed with said female screw and having a length varied depending on turning;
   a locking member restricting the turning of said male screw; and
   a supporting member supporting said male screw on a support surface.

5. A magnetic resonance imaging system according to claim 4, wherein said support surface of said supporting member is a slide surface on which said male screw member can slide.

6. A magnetic resonance imaging system according to claim 5, wherein said slide surface includes rollers arranged to spread radially from the center axis of rotation of said male screw.

7. A magnetic resonance imaging system according to claim 4, wherein said male screw includes a pressed section, and a pressing member that presses a pressed side of said pressed section so as to lock said male screw.

8. A magnetic resonance imaging system according to claim 7, wherein said pressing member includes cover members that clamp said male screw and press said pressed side.

9. A magnetic resonance imaging system according to claim 1, wherein said attenuating device is interposed between said placement surface and said posture adjusting device.

10. A magnetic resonance imaging system according to claim 1, wherein said attenuating device is made of a rubber material.

11. A magnetic resonance imaging system according to claim 10, wherein said rubber material is formed like a sheet.

12. A magnetic resonance imaging system according to claim 11, wherein the resonant frequency of said attenuating device made of said rubber material formed like a sheet ranges from 25 Hz to 30 Hz.

13. A magnetic resonance imaging system according to claim 1, wherein said posture adjusting device is slidably coupled to said attenuating device.

14. A magnetic resonance imaging system comprising:
a magnet that induces a static magnetic field required for magnetic resonance imaging; and
three pieces of supporting device that support said magnet and stand on a placement surface, wherein said three pieces of supporting device each include an attenuating device that attenuates a vibration applied through said placement surface into a vibration having a frequency different from a resonant frequency of said magnet; and
at least two of said three pieces of supporting device include a posture adjusting device that adjusts the posture of said magnet, each said posture adjusting device is slidably coupled to said attenuating device.

15. A magnetic resonance imaging system according to claim 14, wherein said three pieces of supporting device are arranged triangularly.

16. A magnetic resonance imaging system according to claim 15, further comprising another supporting device including another posture adjusting device.

17. A magnetic resonance imaging system according to claim 14, wherein each said posture adjusting device further comprises a bolt member substantially aligned in a Z direction.

18. A magnetic resonance imaging system according to claim 14, wherein each said posture adjusting device is slidably coupled to said attenuating device using a slide surface.

19. A magnetic resonance imaging system according to claim 18, wherein said slide surface includes rollers arranged to spread radially from a center of said attenuating device.

20. A magnetic resonance imaging system according to claim 14, wherein each said posture adjusting device further comprises:
a female screw fixed to an attachment side of said magnet;
a male screw meshed with said female screw and having a length varied depending on turning;
a locking member restricting the turning of said male screw; and
a supporting member supporting said male screw on a support surface, said support member coupled to said attenuating device.

* * * * *